(12) United States Patent  (10) Patent No.: US 7,828,576 B2
Lin et al.  (45) Date of Patent: Nov. 9, 2010

(54) BURN-IN TEST SOCKET HAVING COVER WITH FLOATABLE PUSHER

(75) Inventors: Wei-Chih Lin, Tu-cheng (TW); Hsiu-Yuan Hsu, Tu-cheng (TW); Wen-Yi Hsieh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 180 days.

(21) Appl. No.: 12/288,513

(22) Filed: Oct. 21, 2008

(65) Prior Publication Data

US 2009/0104807 A1 Apr. 23, 2009

(30) Foreign Application Priority Data

Oct. 22, 2007 (TW) .................................. 96217633

(51) Int. Cl.
*H01R 13/62* (2006.01)
(52) U.S. Cl. .................... 439/331; 439/73; 439/341; 439/525
(58) Field of Classification Search ............. 439/70–73, 439/330, 331, 341, 525, 526
See application file for complete search history.

(56) References Cited

U.S. PATENT DOCUMENTS

| 5,469,074 | A | * | 11/1995 | Drabenstadt et al. | 324/758 |
| 7,540,745 | B2 | * | 6/2009 | Lin | 439/73 |
| 7,559,784 | B2 | * | 7/2009 | Hsiao et al. | 439/331 |
| 7,589,521 | B2 | * | 9/2009 | Schubring et al. | 324/158.1 |
| 2007/0259543 | A1 | * | 11/2007 | Hsieh | 439/73 |
| 2009/0104807 | A1 | * | 4/2009 | Lin et al. | 439/341 |

* cited by examiner

*Primary Examiner*—James Harvey
(74) *Attorney, Agent, or Firm*—Andrew C. Cheng; Wei Te Chung; Ming Chieh Chang

(57) ABSTRACT

A test socket comprising an insulative base with a plurality of contacts received in the base and a cover pivotally mounted to one end of the base. The cover comprises a pusher with an opening extending therethrough and a lid aligned with the pusher. The lid has a through hole corresponding to the opening of the pusher. Between the pusher and the lid have a plurality of elastic members for making the lid moveably with respect to the pusher.

14 Claims, 8 Drawing Sheets

BURN-IN TEST SOCKET HAVING COVER WITH FLOATABLE PUSHER

BACKGROUND OF THE INVENTION

1. Field of the Invention

The present invention relates to a test socket, and more particularly to a burn-in test socket, having an improved cover with floatable pusher for making an electronic package to naturally dispose between contacts within the socket and the cover so as to prevent scratching the electronic package disposed therein.

2. Description of the Prior Art

A typical test socket used for electrically connecting an electronic package and a printed circuit board comprises a base for receiving the electronic package, a cover pivotally mounted to one end of the base and a plurality of contacts disposed in the base. The cover is rotated from an open position to a close position for pressing the electronic package. The cover includes a pusher and a lid received in the pusher. When assemble the electronic package to the test socket, the top surface of the lid is against the bottom surface of the pusher and the bottom surface of the lid is pressed on the electronic package. Understandably, the thickness of the lid, the pusher and the base must be exactly controlled so that to assemble the electronic package in a certain height. It is difficult to control the dimension of the elements and generates much accumulated tolerance which will lead the contacts of the socket being compressed too large or small. Thus, the electrical connection will not be reliable. On the other hand, this type of socket can only apply for the package with certain thickness and can not apply for different thickness. Furthermore, even apply for the certain package, the electrical connection will be affected because the contacts are distorted and the contact points thereof are easily changed after long-time usage.

Therefore, an improved design socket which can be adapted to different thickness of electronic package is needed.

SUMMARY OF THE INVENTION

Accordingly, an object of the present invention is to provide a cover which can change the total thickness and a socket with the cover that can assemble to an electronic package of different thickness and establish a well electrical connection.

In order to achieve the object set forth, a socket comprising an insulative base with a plurality of contacts received in the base and a cover pivotally mounted to one end of the base. The cover comprises a pusher with an opening extending therethrough and a lid aligned with the pusher. The lid has a through hole corresponding to the opening of the pusher. Between the pusher and the lid have a plurality of elastic members for making the lid moveably with respect to the pusher.

DESCRIPTION OF PREFERRED EMBODIMENT

Reference will now be made to the drawings to describe the present invention in detail.

Figure 1:
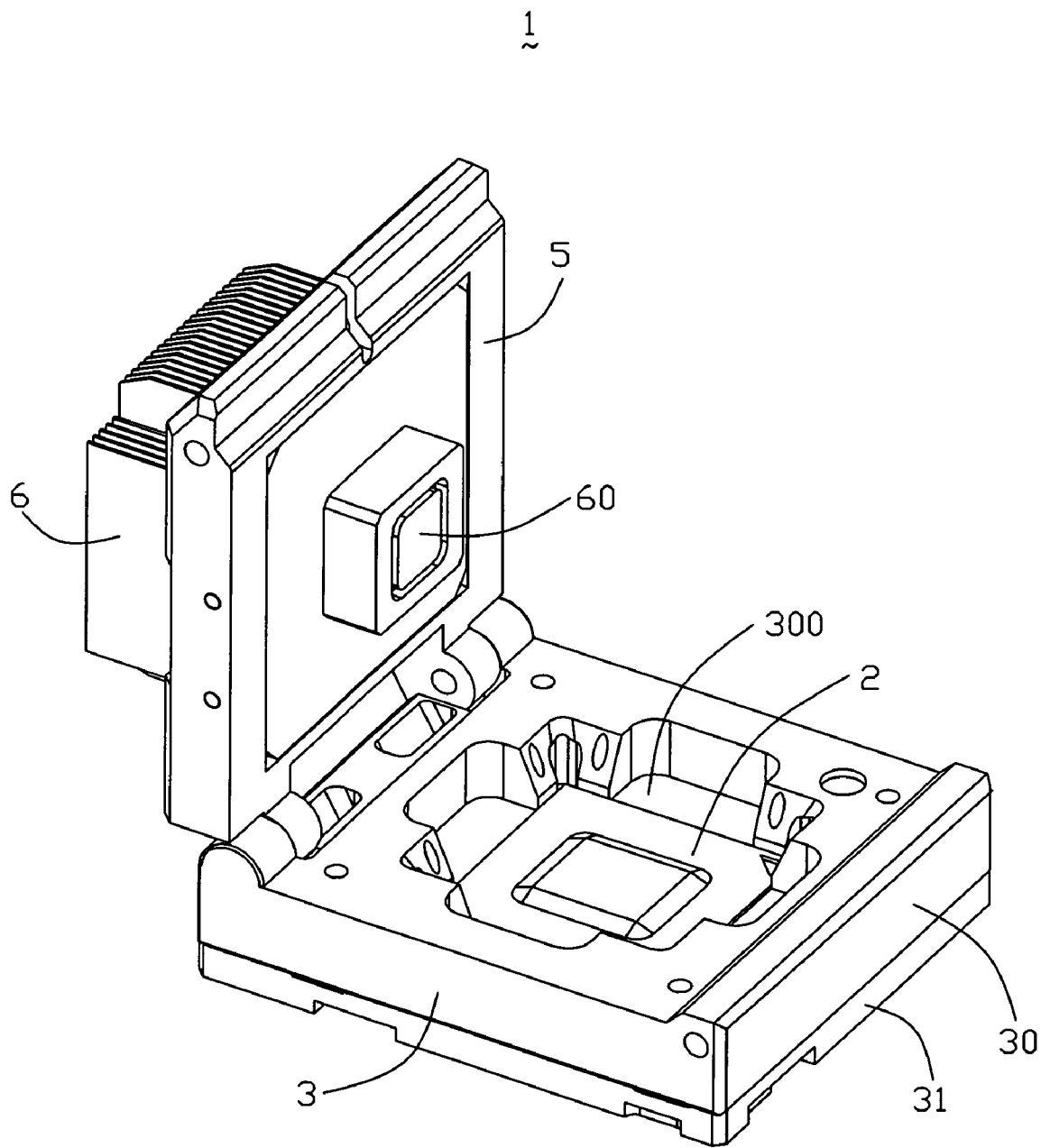
FIG. 1 is an isometric view of a test socket in accordance with the present invention.
Figure 2:
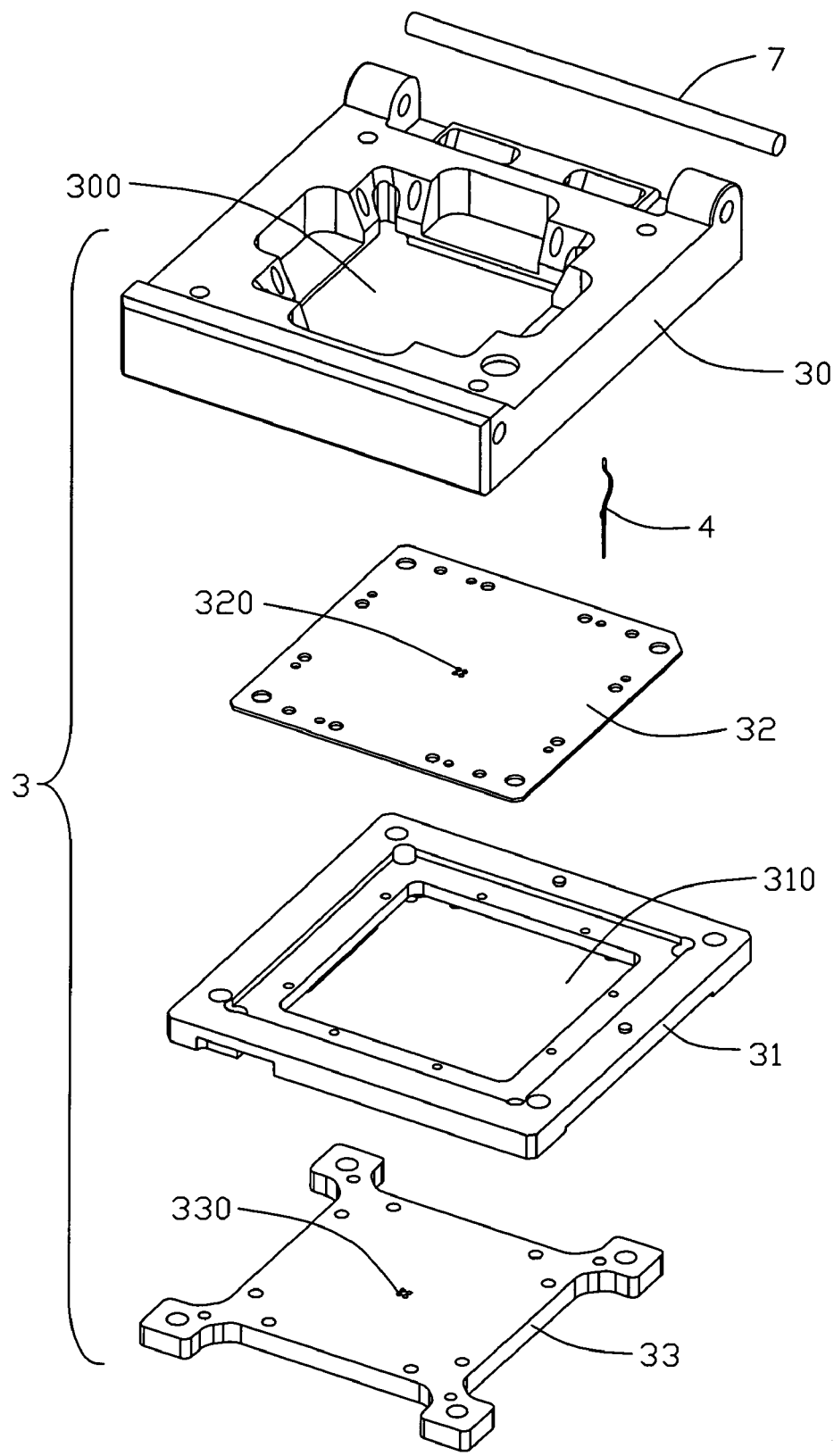
FIG. 2 is an exploded view showing the cover is detached to FIG. 1.
Figure 3:
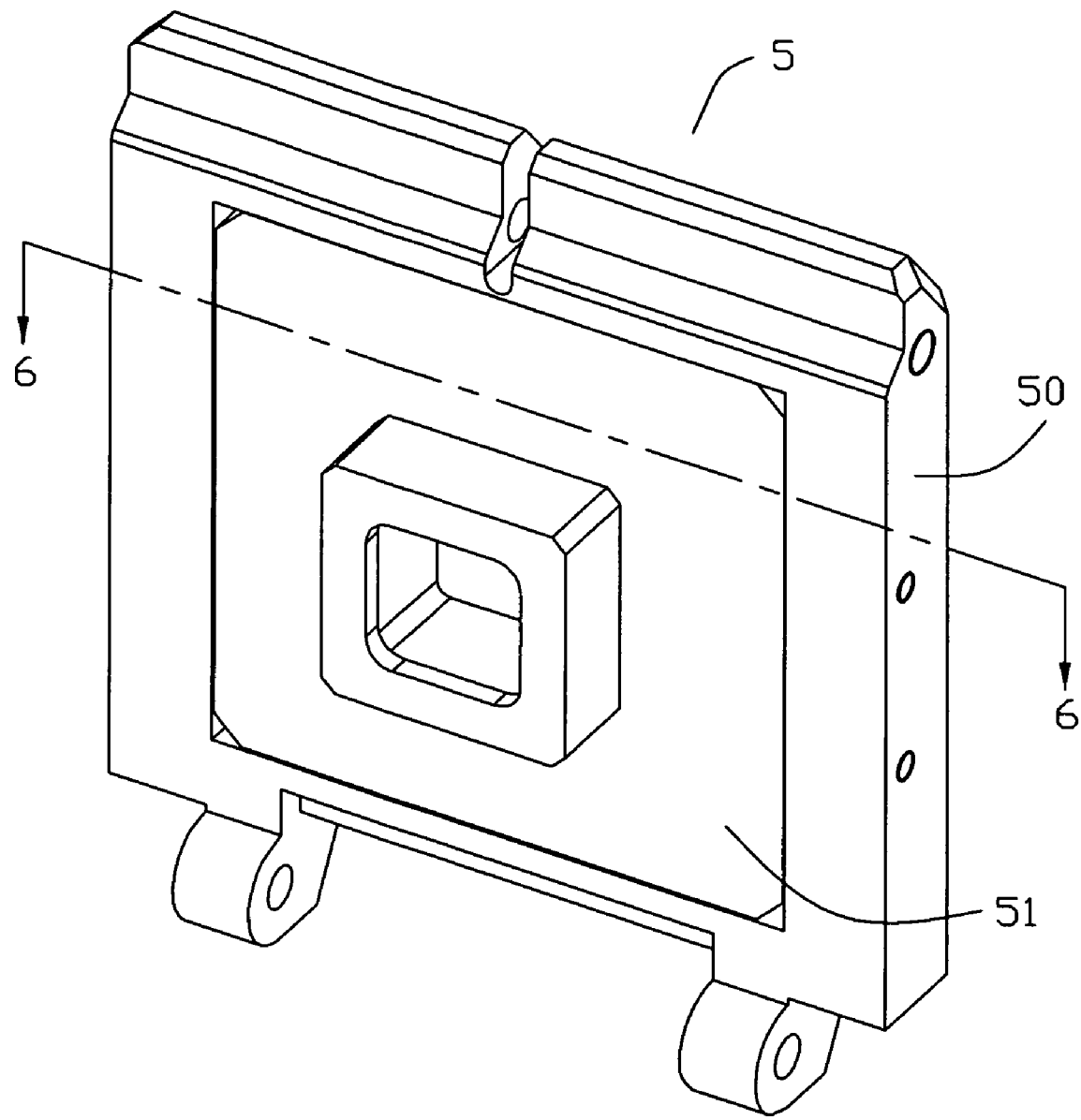
FIG. 3 is an isometric view of the cover and the springs of the test socket.
Figure 4:
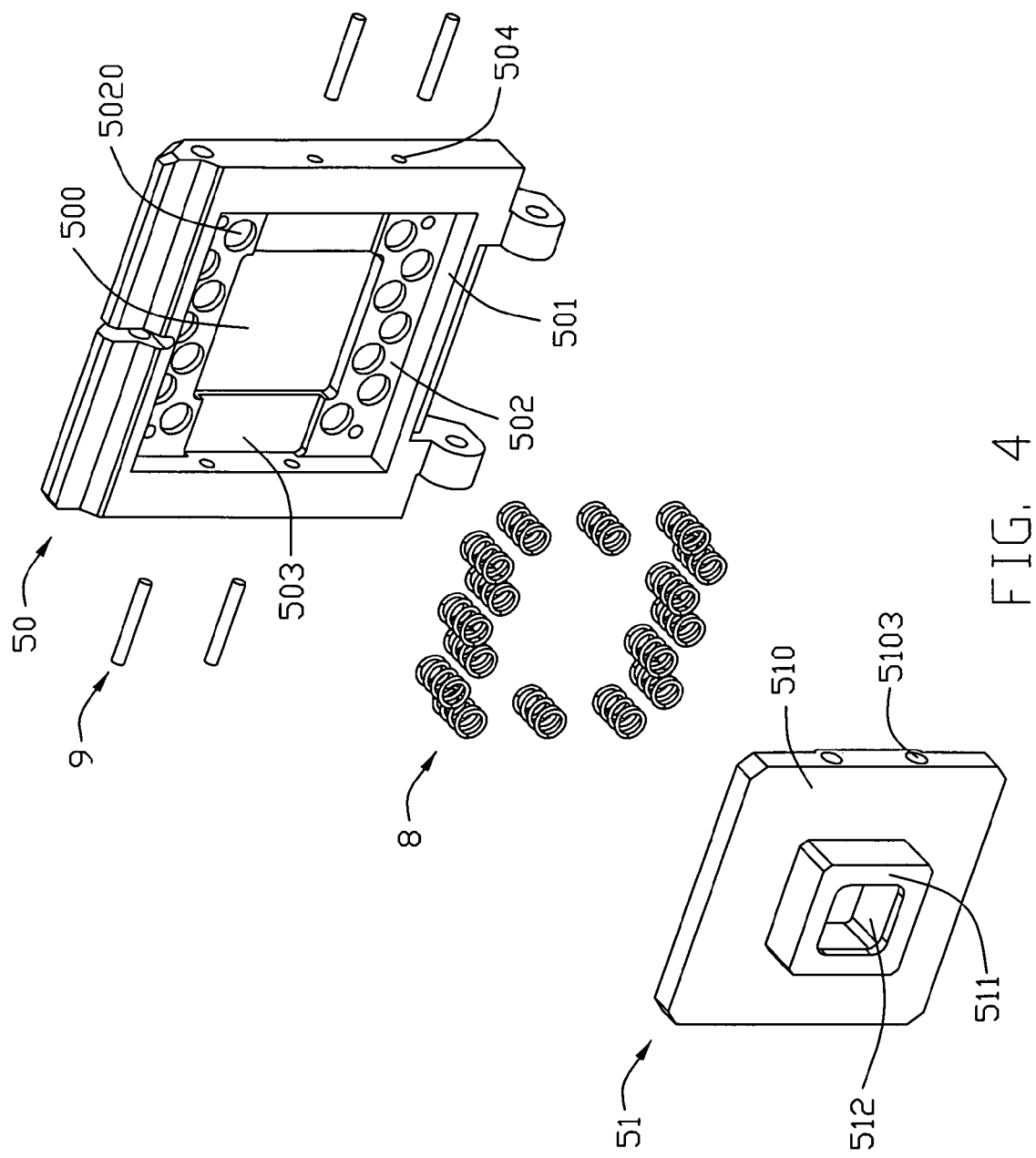
FIG. 4 is an exploded view of the cover and the springs shown in FIG. 3.

Referring to FIG. 1 and FIG. 3, the test socket 1 of the present invention is mounted to a printed circuit board (not shown) and connects with an electronic package 2. The socket 1 comprises a base 3, a plurality of the contacts 4 received in the base 3, a cover 5 pivotally mounted on the base 3 and a heat sink 6 assembled to the cover 5.

The base 3 is made of insulative material and is essentially of a rectangular configuration. The base 3 includes a frame 30, a setting 31 and bottom plate 33 positioned below the setting 31. The frame 30 forms a receiving cavity 300 for accommodating the electronic package 2. The receiving cavity 300 is hollow that is say the receiving cavity 300 without bottom surface thereof. The setting 31 has a center opening 310. The bottom plate 33 defines a plurality of passageways 330 adapted to retain the contacts 4. Besides that, the base 3 further comprises a middle plate 32 disposed between the frame 30 and the setting 31. The middle plate 32 also defines a plurality of passageways 320 corresponding to the passageways 330 of the bottom plate 33 for receiving the contacts 4.

Figure 5:
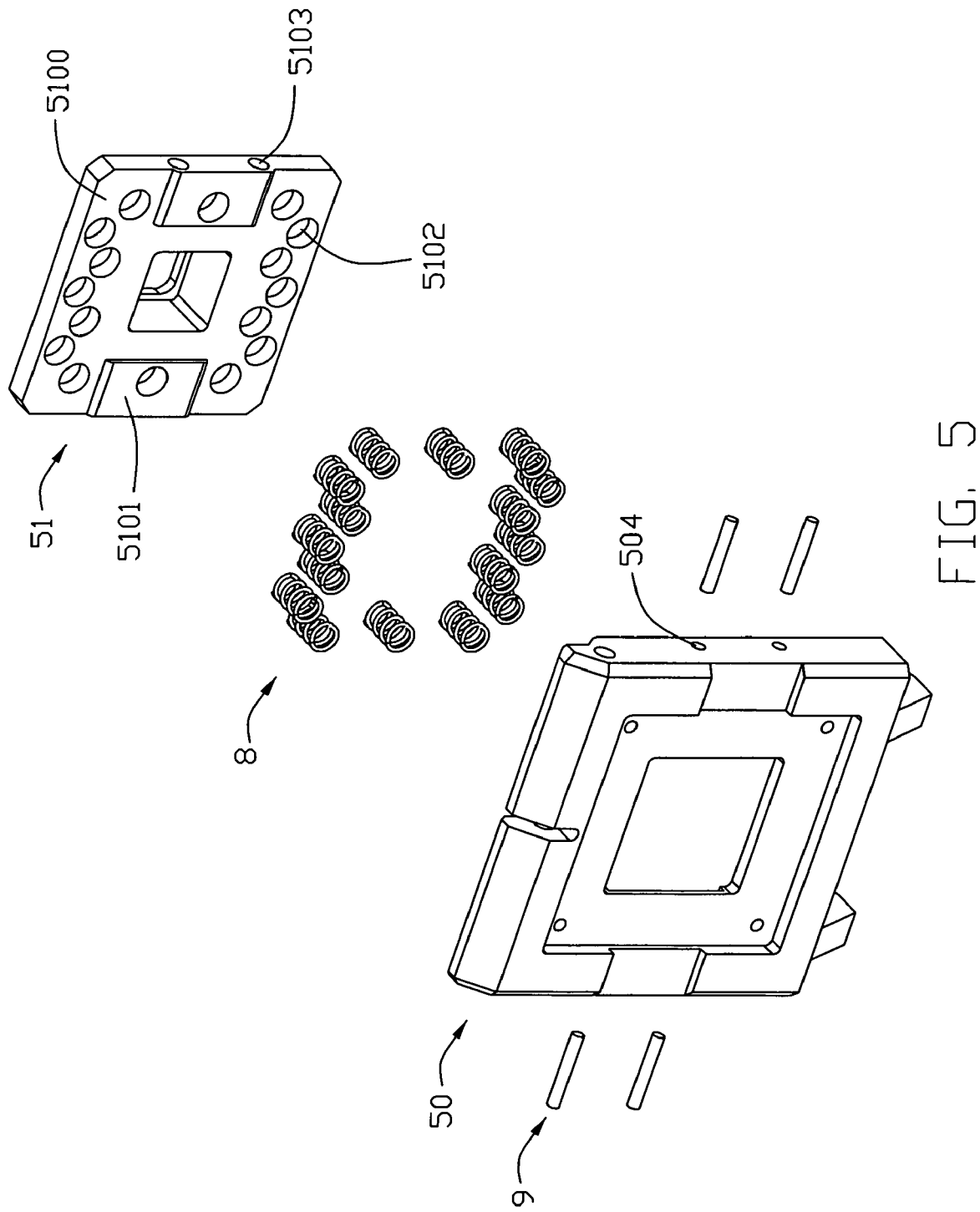
FIG. 5 is another exploded view of the cover and the springs, while taken from a different aspect.
Figure 6:
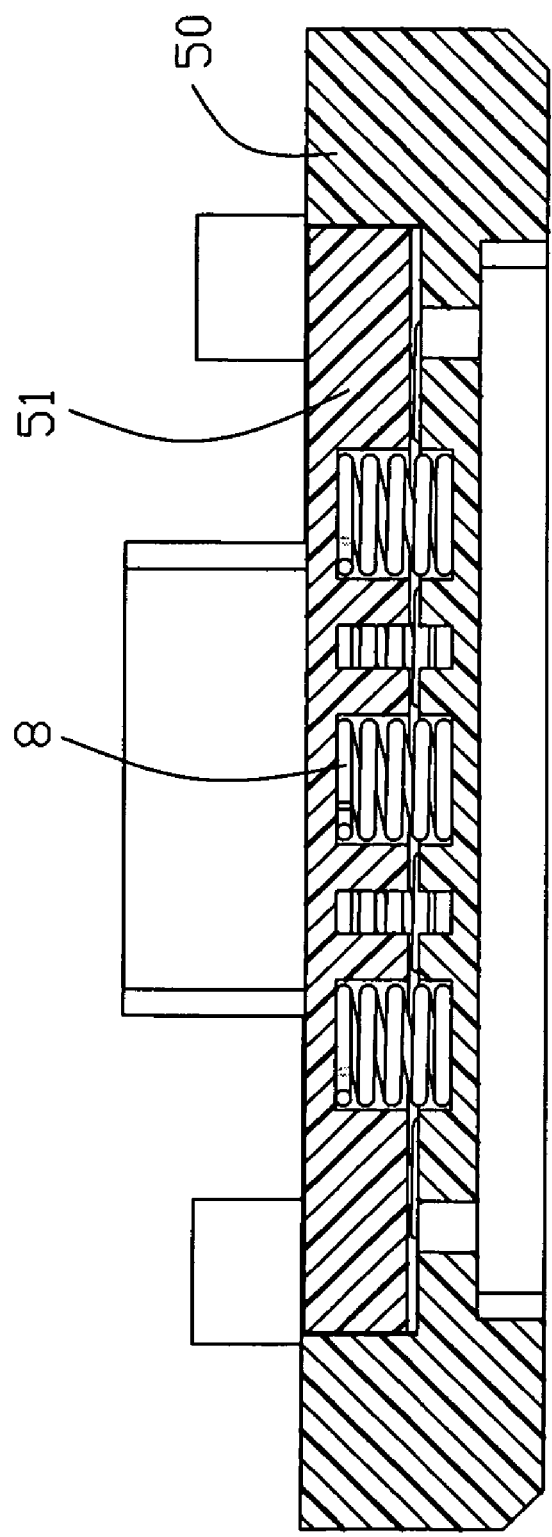
FIG. 6 is a cross-sectional view taken along the line 6-6 of FIG 3.

The cover 5 is connected with the frame 30 via an axis 7. Referring to FIG. 3 and FIG. 5, the cover 5 includes a pusher 50 and a lid 51 assembled to the pusher 50. The pusher 50 is substantially of a rectangular shape and has an opening 500 in a center thereof. The lid 51 comprises a rectangular planar plate as a main body 510 and a loading plate 511 extending downwardly from the center thereof with a through hole 512 corresponding to the opening 500. The bottom area of the pusher 50 forms a rectangular receiving room 501 for receiving the main body 510 of the loading plate 51. The pusher 50 has a bottom surface 502 and a pair of concaves 503 defined on opposite sides of the bottom surface 502. The main body 510 of lid 51 has a top surface 5100 with respect to the bottom surface 502 of the pusher 50 and a pair of protrusions 5101 received in the concaves 503. The top surface 5100 of the main body 510 defines a plurality of first recesses 5102 around the through hole 512, while the bottom surface 502 of the pusher 50 defines a plurality of second recesses 5020 respect to the first recesses 5102. Referring to FIG. 6, a plurality of springs 8 are received in the first recesses 5102 and the second recesses 5020. There is a space between the bottom surface 502 of the pusher 50 and the top surface 5100 of the main body 510 so that the lid 51 could resilient moveable respect to the pusher 50. The pusher 50 and the main body 510 have two pair of threaded holes 504 and contacting holes 5103, respectively. The threaded holes 504 of the pusher 50 and contacting holes 5103 of the main body 510 are fastened in a horizontal direction and the diameter of the contacting holes 5103 is bigger than the threaded holes 504. The pusher 50 and the lid 51 are attached by two pair of screws 9 assembled to the threaded holes 504 and extending into the contacting holes 5103. For the contacting hole 5103 is bigger than the threaded holes 504, there is a clearance between the screw 9 and the contacting holes 5103 so that the lid can float with regard to the pusher 50.

The heat sink 6 comprises a mating portion 60 extending through the opening 500 of the pusher 50 and the through hole 512 of the lid 51. The heat sink 6 contacts to the top surface of the electronic package 2 when the cover 5 is at a close position for efficient heat transfer.

In the present embodiment, a plurality of springs 8 are arranged between the pusher 50 and the lid 51 for making the lid 51 moveably toward the pusher 50 so that the electronic package 2 naturally positioned between the contacts 4 and the cover 5 for avoiding the contacts 4 stocking excessively and insufficiently. The structure of the present invention can bear bigger tolerance such that the manufacture is easy. The structure also can be adapted to various thickness of electronic package 2 and various heights of contacts 4.

Figure 7:
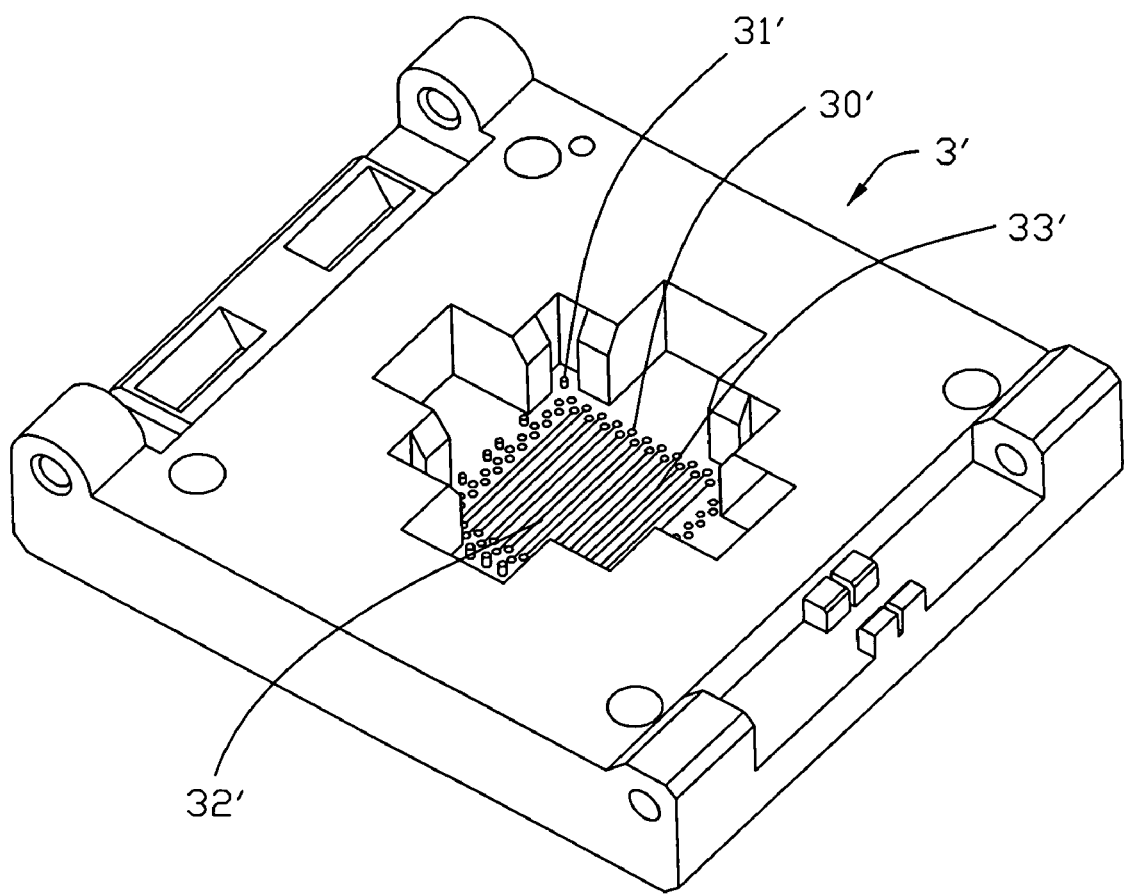
FIG. 7 is an isometric view of an alternative embodiment of the cover of the test socket.
Figure 8:
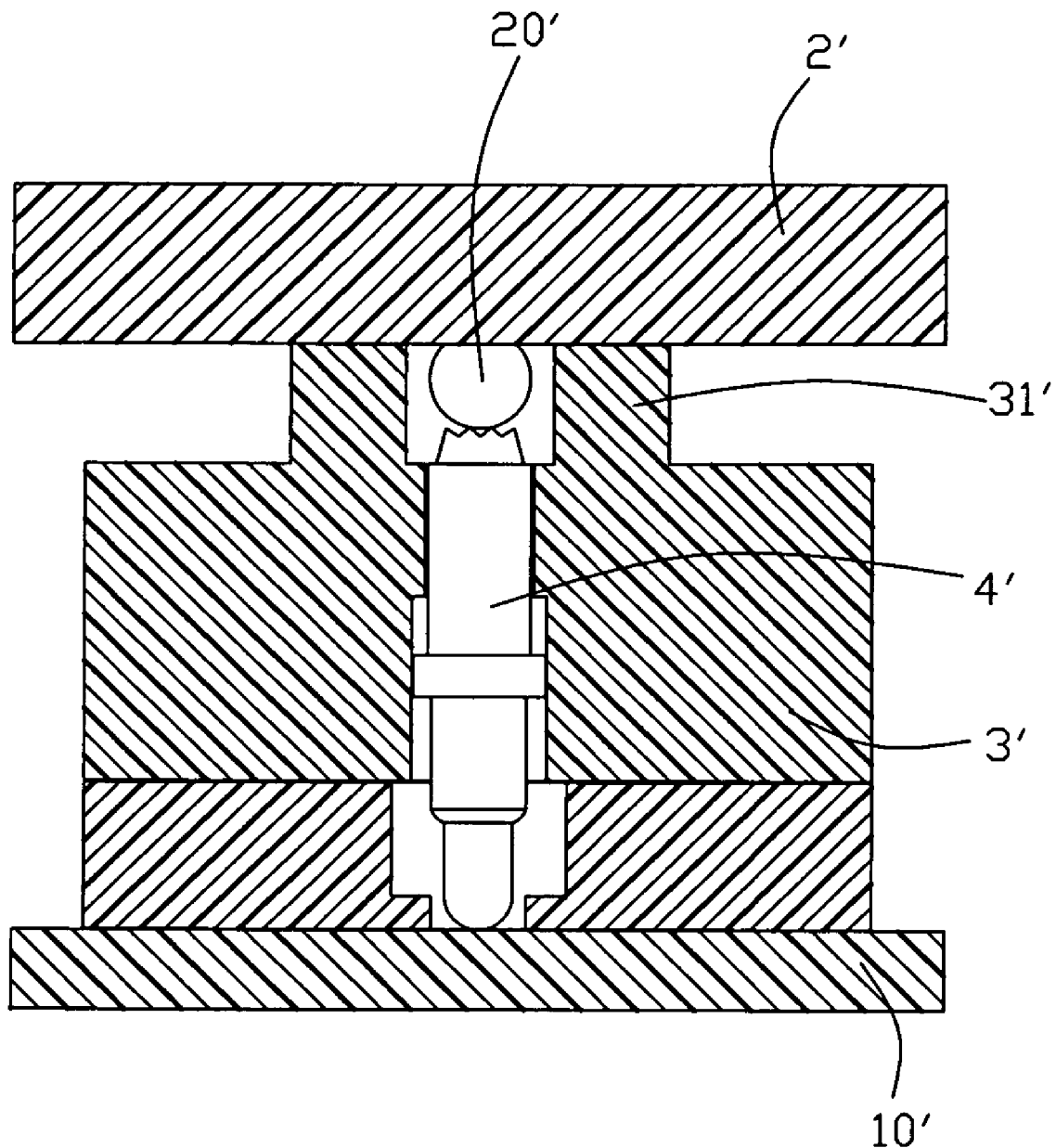
FIG. 8 is a cross-sectional view of the part of the test socket shown in FIG. 7.

Referring to FIG. 7 and FIG. 8, shown a second embodiment of the present, illustrate the test socket electrically connected with an electronic package 2' with solder balls 20' and aligned on the printed circuit board 10'. The structure of the socket is similar to the first embodiment and comprises a base 3', a plurality of contacts 4' received in the base 3', a cover (not shown) pivotally mounted on the base 3' and a heat sink (not shown) mounted on the cover, except the structure of the base 3' is different from the first embodiment. In this embodiment, the base 3' has a bottom plate 33' and defines a receiving cavity 32' and a plurality of passageways for receiving the contacts 4' therein. There are a number of posts 31' extending upwardly from the bottom plate 33' against the electronic package 2'. The post 61' is higher than the contact 4'. The process of assembly the electronic package 2' to the socket are as follows: firstly, assemble the electronic package 2' to the socket thereby the solder balls 20' of the electronic package 2' contacting with the contacts 4'; secondly, press the cover against the electronic package 2', so that the solder balls 20' downwardly press the contacts 4' and establish a sufficient electrical connection therebetween. Under this condition, the contacts 4' will be accurately controlled.

The principle of the present invention is to provided a cover having a plurality of springs between the pusher and the lid of the cover so that the lid moveably toward the pusher to keep the electronic package at normal position. If the electronic package disposed in a lower position, the contacts force is greater than the spring force and will push the electronic package upwardly moved to the normal position; and if the electronic package disposed in a higher position, the spring force is greater than the contacts force and will press the electronic package downwardly moved to the normal position. Thus, present invention just need to control the height of the posts, and needn't control the thickness of the lid, the pusher and the base strictly thereby make the socket manufactured easily. Understandably, the structure of the present can not make the electronic package stroke excessively and stroke insufficiently.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A test socket comprising:
   an insulative base with a plurality of contacts received in the base;
   a cover pivotally mounted to one end of the base and comprising a pusher with an opening extending therethrough and a lid aligned with the pusher, the lid having a through hole corresponding to the opening of the pusher; wherein
   a plurality of elastic members are arranged between the pusher and the lid for making the lid moveably with respect to the pusher.

2. The test socket as claimed in claim 1, wherein the elastic members are a plurality of springs.

3. The test socket as claimed in claim 1, wherein the pusher defines a plurality of first recesses in a bottom surface thereof and the lid defines a plurality of second recesses in a top surface thereof, and wherein the elastic members are received in the first and second recesses.

4. The test socket as claimed in claim 3, wherein the pusher defines a receiving room, and wherein the lid has a rectangular main body received in the receiving room and a loading portion extending downwardly from the main body.

5. The test socket as claimed in claim 4, wherein the bottom surface of the pusher has a pair of concaves at opposite sides of the opening and the top surface of the lid has protrusions received in the concaves, respectively.

6. The test socket as claimed in claim 5, wherein the main body defines a plurality of contacting holes extending in a horizontal direction and the pusher has a plurality of threaded holes corresponding to the contacting holes and wherein the diameter of the contacting holes of the main body is larger than the threaded holes.

7. The test socket as claimed in claim 6, wherein the pusher and the lid are fastened by a plurality of screws, and wherein the screws are fitted to the threaded holes of the pusher and extending into the contacting holes, and wherein the diameter of the screws are smaller than the contacting holes of the main body.

8. The test socket as claimed in claim 1, wherein the base further comprises a frame, a middle plate, a setting and a bottom plate, and wherein the middle plate and the bottom plate have corresponding passageways for receiving the contacts.

9. The test socket as claimed in claim 8, wherein the frame and the middle plate forms a receiving cavity, and wherein a plurality of posts are defined on the middle plate and extending upwardly for supporting the electronic package.

10. The test socket as claimed in claim 1, wherein the base forms a unitary receiving cavity with a bottom surface defined a plurality of passageways extending downwardly for receiving the contacts and defined a plurality of posts extending upwardly for supporting the electronic package.

11. The test socket as claimed in claim 10, wherein the posts are higher than contacts.

12. The test socket as claimed in claim 1, wherein the socket further comprises a heat sink disposed on the cover, and the heat sink comprises a mating portion extending through the opening of the pusher and the through hole of the lid.

13. An electrical socket for use with an electronic package, comprising:
   a base defining a receiving cavity for receiving said electronic package;
   a plurality of contacts disposed in the base with contacting sections upwardly extending into the receiving cavity;
   a cover including a pusher pivotally mounted to one edge of the base and defining a receiving room in an underside thereof, and a lid located in said receiving room in a floating manner so as to have a cushioning pressure against the electronic package thereunder; wherein the lid and the cover are assembled via a horizontal bar with two opposite ends respectively extending into the pusher and the lid respectively, under a condition that the bar is immoveable relative to the pusher while moveable relative to the lid in a vertical direction.

14. An electrical socket for use with an electronic package, comprising:

a base defining a receiving cavity for receiving said electronic package;

a plurality of contacts disposed in the base with contacting sections upwardly extending into the receiving cavity;

a cover including a pusher pivotally mounted to one edge of the base and defining a receiving room in an underside thereof, and a lid located in said receiving room in a floating manner so as to have a cushioning pressure against the electronic package thereunder; wherein a spring is sandwiched between the lid and the pusher.

* * * * *